(12) United States Patent
Kimball et al.

(10) Patent No.: US 11,190,148 B2
(45) Date of Patent: Nov. 30, 2021

(54) MINIMIZING IDLE CHANNEL NOISE IN A CLASS-D PULSE WIDTH MODULATION AMPLIFIER

(71) Applicant: Cirrus Logic International Semiconductor Ltd., Edinburgh (GB)

(72) Inventors: Eric Kimball, Austin, TX (US); Chandra Prakash, Austin, TX (US); Ramin Zanbaghi, Austin, TX (US); Cory J. Peterson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 64 days.

(21) Appl. No.: 16/732,993

(22) Filed: Jan. 2, 2020

(65) Prior Publication Data

US 2021/0211099 A1   Jul. 8, 2021

(51) Int. Cl.
*H03F 1/36* (2006.01)
*H03F 1/26* (2006.01)
*H03F 3/183* (2006.01)
*H03F 3/217* (2006.01)

(52) U.S. Cl.
CPC .............. *H03F 1/26* (2013.01); *H03F 3/183* (2013.01); *H03F 3/217* (2013.01)

(58) Field of Classification Search
CPC ............. H03F 3/181; H03F 3/217; H03F 3/38
USPC ................ 330/10, 86, 251; 381/120, 121
See application file for complete search history.

(56) References Cited

U.S. PATENT DOCUMENTS

| | | | |
|---|---|---|---|
| 2002/0105449 A1 | 8/2002 | Schreier et al. | |
| 2009/0322425 A1* | 12/2009 | Shako | H03F 1/3247 330/149 |
| 2010/0246852 A1 | 9/2010 | Tai | |
| 2012/0230520 A1 | 9/2012 | Lim | |
| 2013/0093515 A1 | 4/2013 | Cheng | |
| 2016/0072465 A1 | 3/2016 | Das et al. | |
| 2016/0080862 A1 | 3/2016 | He et al. | |
| 2018/0098149 A1 | 4/2018 | Das et al. | |
| 2018/0212569 A1 | 7/2018 | Zhu et al. | |
| 2018/0295442 A1 | 10/2018 | Das | |
| 2019/0149107 A1 | 5/2019 | He et al. | |

OTHER PUBLICATIONS

International Search Report and Written Opinion of the International Searching Authority, International Application No. PCT/US2020/065364, dated Apr. 16, 2021.

* cited by examiner

*Primary Examiner* — Steven J Mottola
(74) *Attorney, Agent, or Firm* — Jackson Walker L.L.P.

(57) ABSTRACT

A system may include a forward signal path having a forward gain and configured to receive an input signal at an input and generate an output signal at an output as a function of the input signal, a feedback signal path having a feedback gain and coupled between the output and the input, and a control subsystem configured to operate the forward signal path and the feedback signal path in at least two modes comprising a first mode in which the forward gain is a first forward gain and the feedback gain is a first feedback gain and a second mode in which the forward gain is a second forward gain smaller than the first forward gain and the feedback gain is a second feedback gain larger than the first feedback gain. The control subsystem may cause operation in the first mode when signal content is present in the input signal and may cause operation in the second mode when signal content is absent from the input signal.

20 Claims, 3 Drawing Sheets

MINIMIZING IDLE CHANNEL NOISE IN A CLASS-D PULSE WIDTH MODULATION AMPLIFIER

FIELD OF DISCLOSURE

The present disclosure relates in general to circuits for audio devices, including without limitation personal audio devices, such as wireless telephones and media players, and more specifically, to systems and methods for minimizing idle channel noise in a class-D pulse width modulation amplifier.

BACKGROUND

Personal audio devices, including wireless telephones, such as mobile/cellular telephones, cordless telephones, mp3 players, and other consumer audio devices, are in widespread use. Such personal audio devices may include circuitry for driving a pair of headphones or one or more speakers. Such circuitry often includes a power amplifier for driving an audio output signal to headphones or speakers. Generally speaking, a power amplifier amplifies an audio signal by taking energy from a power supply and controlling an audio output signal to match an input signal shape but with a larger amplitude.

One example of an audio amplifier is a class-D amplifier. A class-D amplifier (also known as a "switching amplifier") may comprise an electronic amplifier in which the amplifying devices (e.g., transistors, typically metal-oxide-semiconductor field effect transistors) operate as electronic switches. In a class-D amplifier, a signal to be amplified may be converted to a series of pulses by pulse-width modulation (PWM), pulse-density modulation (PDM), or another method of modulation, such that the signal is converted into a modulated signal in which a characteristic of the pulses of the modulated signal (e.g., pulse widths, pulse density, etc.) is a function of the magnitude of the signal. After amplification with a class-D amplifier, the output pulse train may be converted to an unmodulated analog signal by passing through a passive low-pass filter, wherein such low-pass filter may be inherent in the class-D amplifier or a load driven by the class-D amplifier. Class-D amplifiers are often used due to the fact that they may be more power efficient than linear analog amplifiers, in that class-D amplifiers may dissipate less power as heat in active devices as compared to linear analog amplifiers.

In class-D amplifiers as well as other audio amplifiers, it is often desirable to minimize idle channel noise. Idle channel noise may be defined as an amount of noise output by an amplifier in the absence of a signal being driven to a signal path comprising the amplifier. In types of amplifiers other than class-D amplifiers, idle channel noise is reduced or eliminated by clamping an output of the amplifier to a ground voltage. However, in a class-D amplifier, during the presence of an idle channel, the inputs to the class-D amplifier may toggle at a 50 percent duty cycle. Accordingly, clamping an output of a class-D amplifier to a ground voltage may not be possible unless the driver loop of the class-D amplifier is placed into an open circuit. Further, such clamping to a ground voltage in a class-D amplifier may be likely to cause audio artifacts that may be perceptible to a listener.

SUMMARY

In accordance with the teachings of the present disclosure, one or more disadvantages and problems associated with existing approaches to minimizing idle channel noise may be reduced or eliminated.

In accordance with embodiments of the present disclosure, a system may include a forward signal path having a forward gain and configured to receive an input signal at an input and generate an output signal at an output as a function of the input signal, a feedback signal path having a feedback gain and coupled between the output and the input, and a control subsystem configured to operate the forward signal path and the feedback signal path in at least two modes comprising a first mode in which the forward gain is a first forward gain and the feedback gain is a first feedback gain and a second mode in which the forward gain is a second forward gain smaller than the first forward gain and the feedback gain is a second feedback gain larger than the first feedback gain. The control subsystem may cause operation in the first mode when signal content is present in the input signal and may cause operation in the second mode when signal content is absent from the input signal.

In accordance with these and other embodiments of the present disclosure, a method may include, in a system having a forward signal path having a forward gain and configured to receive an input signal at an input and generate an output signal at an output as a function of the input signal and a feedback signal path having a feedback gain and coupled between the output and the input operating the forward signal path and the feedback signal path in at least two modes comprising a first mode in which the forward gain is a first forward gain and the feedback gain is a first feedback gain and a second mode in which the forward gain is a second forward gain smaller than the first forward gain and the feedback gain is a second feedback gain larger than the first feedback gain. The method may further comprise operating in the first mode when signal content is present in the input signal and operating in the second mode when signal content is absent from the input signal.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
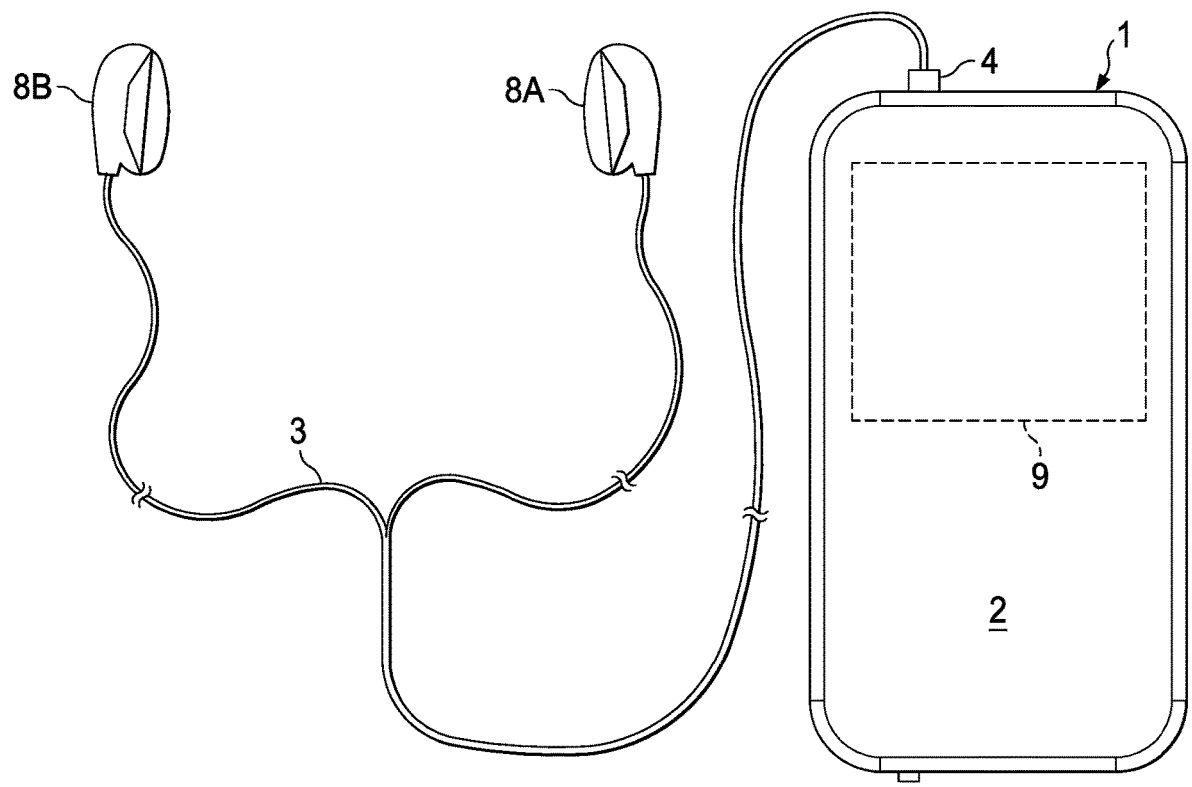
FIG. 1 is an illustration of an example personal audio device, in accordance with embodiments of the present disclosure.

FIG. 1 is an illustration of an example personal audio device 1, in accordance with embodiments of the present disclosure. FIG. 1 depicts personal audio device 1 coupled to a headset 3 in the form of a pair of earbud speakers 8A and 8B. Headset 3 depicted in FIG. 1 is merely an example, and it is understood that personal audio device 1 may be used in connection with a variety of audio transducers, including without limitation, headphones, earbuds, in-ear earphones, and external speakers. A plug 4 may provide for connection of headset 3 to an electrical terminal of personal audio device 1. Personal audio device 1 may provide a display to a user and receive user input using a touch screen 2, or alternatively, a standard liquid crystal display (LCD) may be combined with various buttons, sliders, and/or dials disposed on the face and/or sides of personal audio device 1. As also shown in FIG. 1, personal audio device 1 may include an audio integrated circuit (IC) 9 for generating an analog audio signal for transmission to headset 3 and/or another audio transducer.

Figure 2:
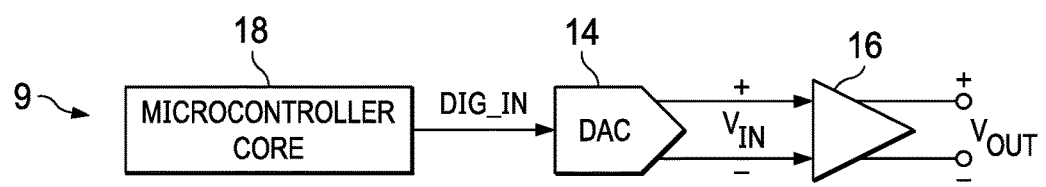
FIG. 2 illustrates a block diagram of selected components of an example audio integrated circuit of a personal audio device, in accordance with embodiments of the present disclosure.

FIG. 2 illustrates a block diagram of selected components of an example audio IC 9 of a personal audio device, in accordance with embodiments of the present disclosure. In some embodiments, example audio IC 9 may be used to implement audio IC 9 of FIG. 1. As shown in FIG. 2, a microcontroller core 18 may supply a digital audio input signal DIG_IN to a digital-to-analog converter (DAC) 14, which may convert the digital audio input signal to an analog input signal $V_{IN}$. DAC 14 may supply analog input signal $V_{IN}$ to an amplifier 16 which may amplify or attenuate analog input signal $V_{IN}$ to provide an audio output signal $V_{OUT}$, which may operate a speaker, headphone transducer, a line level signal output, and/or other suitable output.

Figure 3:
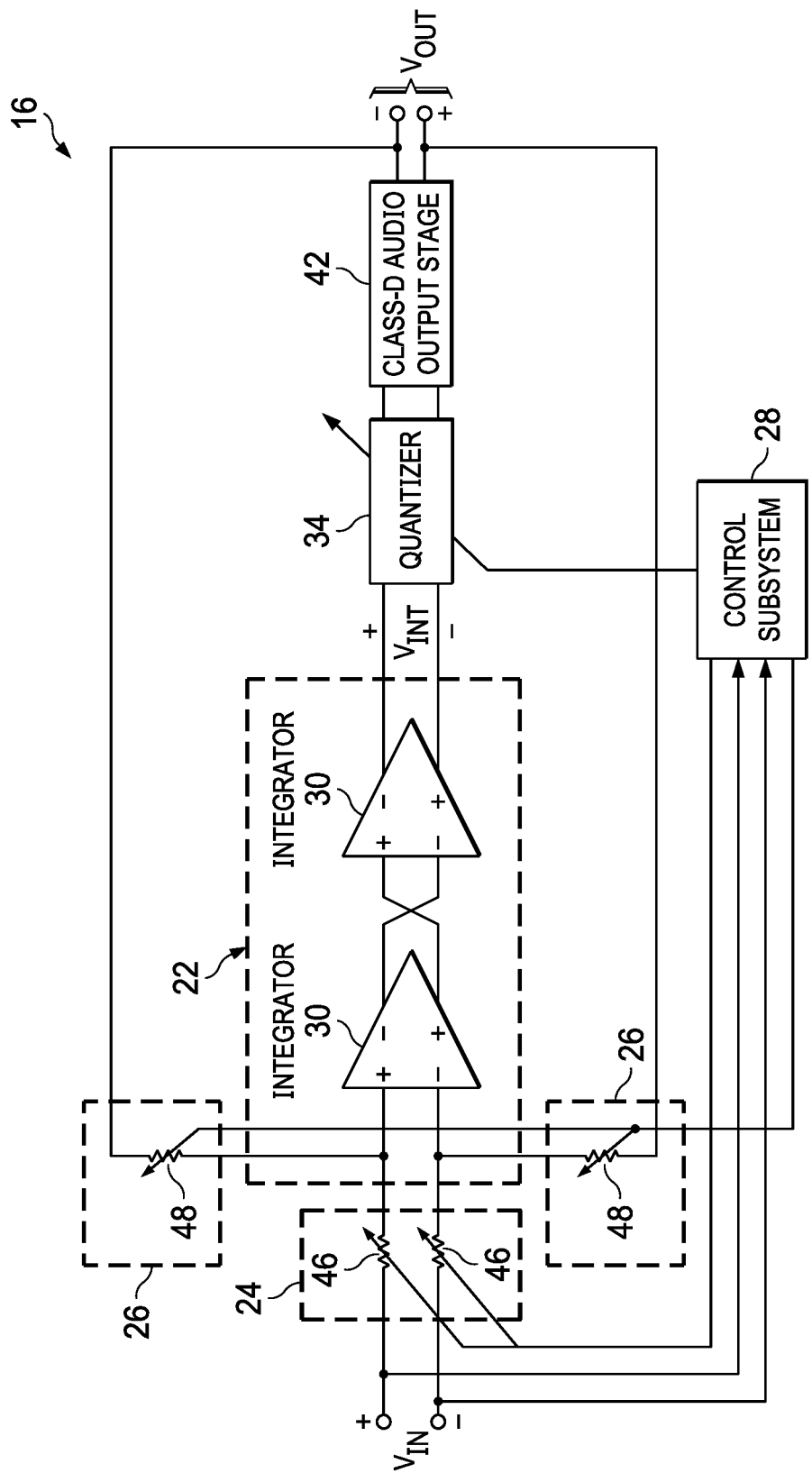
FIG. 3 illustrates a block diagram of selected components of an example amplifier, in accordance with embodiments of the present disclosure.

FIG. 3 illustrates a block diagram of selected components of an example amplifier 16, in accordance with embodiments of the present disclosure. In some embodiments, amplifier 16 may be used to implement all or a portion of amplifier 16 of FIG. 2. As shown in FIG. 3, amplifier 16 may include a signal input network 24, a first stage 22 (e.g., an analog front end) configured to receive analog input signal $V_{IN}$ at an amplifier input of amplifier 16 and generate an intermediate signal $V_{INT}$ which is a function of analog input signal $V_{IN}$, a quantizer 34, a final output stage comprising a class-D audio output stage 42 configured to generate audio output signal $V_{OUT}$ at an amplifier output of amplifier 16 as a function of quantized intermediate signal $V_{INT}$, a signal feedback network 26 coupled between the amplifier output and the amplifier input, and a control subsystem 28 for controlling the operation of certain components of amplifier 16, as described in greater detail below.

Signal input network 24 may include any suitable input network receiving the amplifier input of amplifier 16. For example, as shown in FIG. 3, signal input network 24 may include variable input resistors 46, wherein resistances of variable input resistors 46 are controlled by control signals received from control subsystem 28, as described in greater detail below.

First stage 22 may include any suitable analog front end circuit for conditioning analog input signal $V_{IN}$ for use by class-D audio output stage 42. For example, first stage 22 may include one or more analog integrators 30 cascaded in series, as shown in FIG. 3.

Quantizer 34 may comprise any system, device, or apparatus configured to quantize intermediate signal $V_{INT}$ to generate an equivalent digital PWM signal. As shown in FIG. 3, quantizer 34 may have a variable signal gain controlled by one or more control signals received from control subsystem 28, as described in greater detail below.

Class-D audio output stage 42 may comprise any system, device, or apparatus configured to receive the output of quantizer 34 and drive an output signal $V_{OUT}$ which is an amplified version of analog input signal $V_{IN}$. Accordingly, class-D audio output stage 42 may comprise a plurality of output switches configured to generate output signal $V_{OUT}$ from a modulated signal generated by quantizer 34. After amplification by class-D audio output stage 42, its output pulse train may be converted back to an unmodulated analog signal by passing through a passive low-pass filter, wherein such low-pass filter may be inherent in output circuitry of class-D audio output stage 42 or a load driven by class-D audio output stage 42.

Signal feedback network 26 may include any suitable feedback network for feeding back a signal indicative of audio output signal $V_{OUT}$ to the amplifier input of amplifier 16. For example, as shown in FIG. 3, signal input network 26 may include variable feedback resistors 48, wherein resistances of variable feedback resistors 48 are controlled by control signals received from control subsystem 28, as described in greater detail below. Those of skill in the art may recognize that a closed loop gain of amplifier 16 may be set by a ratio of the resistances of variable feedback resistors 48 to the resistances of variable input resistors 46.

Control subsystem 28 may include any suitable system, device, or apparatus configured to receive information indicative of audio input signal $V_{IN}$ and based at least thereon, control operation of one or more components of amplifier 16. For example, control subsystem 28 may be configured to, based on a characteristic of analog input signal $V_{IN}$ (e.g., the presence or absence of an idle channel), switch between a first gain mode and a second gain mode amplifier. For example, in the absence of an idle channel (e.g., the presence of signal content in analog input signal $V_{IN}$), control subsystem 28 may cause amplifier 16 to operate in the first mode in which quantizer 34 has a first gain, signal feedback network 26 has a first feedback impedance, and signal input network 24 has a first input impedance.

However, in the presence of an idle channel (e.g., the absence of signal content in analog input signal $V_{IN}$), control subsystem 28 may cause amplifier 16 to operate in the second mode. In the second mode, control subsystem 28 may reduce the impedance of signal feedback network 26 to a second feedback impedance smaller than the first feedback impedance and reduce the impedance of signal input network 24 to a second input impedance smaller than the first input impedance. Reducing the impedance of signal feedback network 26 may have the effect of increasing a gain of signal feedback network 26 by a factor equal to the factor of decrease of the impedance of the signal feedback network. Reducing such impedances may reduce the presence of noise within the loop of amplifier 16, thus reducing idle channel noise. In order to maintain an open loop amplifier gain for amplifier 16 between the first mode and the second mode, control subsystem 28 may control signal feedback network 26 and signal input network 24 such that a ratio between the first feedback impedance and the first input impedance is approximately equal to a ratio between the second feedback impedance and the second input impedance. Further, in the second mode, to compensate for the reduction of the feedback impedance and maintain the loop dynamics of amplifier 16, control subsystem 28 may also reduce the gain of quantizer 34 to a second gain lower than the first gain, such that a ratio between the second feedback impedance and the first feedback impedance is approximately equal to a ratio between the second gain and the first gain. Thus, when switching from the first mode to the second mode, control subsystem 28 may cause reduction of the feedback impedance and the gain of quantizer 34 by approximately the same factor (e.g., a factor of four). In some embodiments, when switching from the first mode to the second mode, control subsystem 28 may also cause reduction in the input impedance by the same factor.

Figure 4:
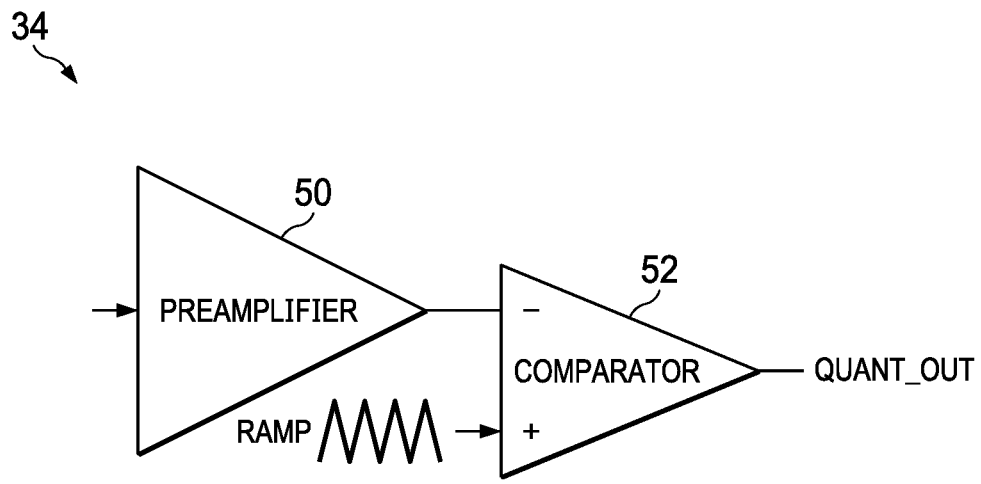
FIG. 4 illustrates a block diagram of selected components of an example quantizer, in accordance with embodiments of the present disclosure.

Reduction of the gain of quantizer 34 may require some care, as quantizer noise may be one component of idle channel noise. To illustrate, FIG. 4 illustrates a block diagram of selected components of an example quantizer 34, in accordance with embodiments of the present disclosure. As shown in FIG. 4, quantizer 34 may include a preamplifier 50 followed by a comparator 52 that may compare the output of preamplifier 50 to a periodic triangular waveform to generate a pulse-width modulated output signal QUANT_OUT from quantizer 34. The rate of change of the periodic triangular waveform may set a gain for comparator 52—slower rates of change may create higher comparator gain and faster rates of change may create lower comparator gain.

Figure 5:
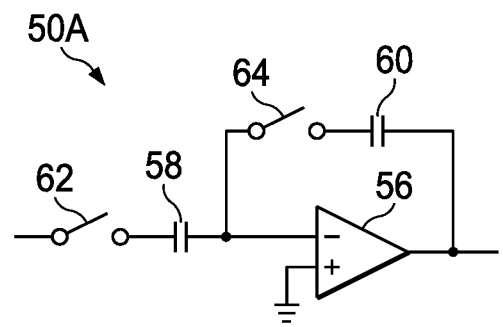
FIG. 5 illustrates a block diagram of selected components of one example preamplifier for a quantizer, in accordance with embodiments of the present disclosure.

FIG. 5 illustrates a block diagram of selected components of one example preamplifier 50A for quantizer 34, in accordance with embodiments of the present disclosure. In some embodiments, preamplifier 50A may be used to implement preamplifier 50 of FIG. 4. Preamplifier 50A may comprise a switched capacitor gain circuit including an operational amplifier 56 with an input switched capacitor comprising a capacitor 58 and a switch 62 and an output switched capacitor comprising a capacitor 60 and a switch 64, all arranged as shown in FIG. 5. A gain of preamplifier 50A may be set by a ratio between a capacitance of capacitor 60 and a capacitance of capacitor 58.

Figure 6:
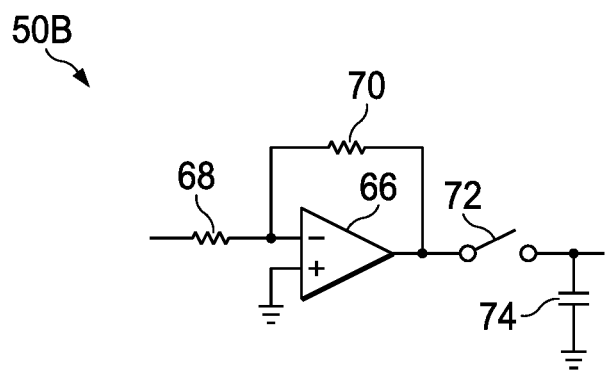
FIG. 6 illustrates a block diagram of selected components of another example preamplifier for a quantizer, in accordance with embodiments of the present disclosure.

FIG. 6 illustrates a block diagram of selected components of another example preamplifier 50B for quantizer 34, in accordance with embodiments of the present disclosure. In some embodiments, preamplifier 50B may be used to implement preamplifier 50 of FIG. 4. Preamplifier 50B may comprise a gain circuit including an operational amplifier 66 with an input resistor 68, a feedback resistor 70, and a sample-and-hold circuit comprising a capacitor 74 and a switch 72, all arranged as shown in FIG. 6. A gain of preamplifier 50B may be set by a ratio between a resistance of resistor 70 and a resistance of resistor 68.

Accordingly, to reduce quantizer gain, one may reduce gain of preamplifier 50, comparator 52, or both. However, in many instances, it may be most desirable to reduce quantizer gain by applying gain reduction to comparator 52, because: (a) in the case of reducing gain in a switched-capacitor based preamplifier 50A, reducing preamplifier gain by a factor may require increasing capacitance of capacitor 60 by the same factor, which may require an increase in area of capacitor 60 by the same factor; and (b) in the case of reducing gain in a resistor-based preamplifier 50B, reducing preamplifier gain by the factor may not reduce noise output power of quantizer 34. However, reducing gain of comparator 52 by a factor may result in a reduction of quantizer noise output power without a significant increase in area.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A system comprising:
a forward signal path having a forward gain and configured to receive an input signal at an input and generate an output signal at an output as a function of the input signal;
a feedback signal path having a feedback gain and coupled between the output and the input; and
a control subsystem configured to operate the forward signal path and the feedback signal path in at least two modes comprising:
a first mode in which the forward gain is a first forward gain and the feedback gain is a first feedback gain; and
a second mode in which the forward gain is a second forward gain smaller than the first forward gain and the feedback gain is a second feedback gain larger than the first feedback gain;
wherein the control subsystem causes operation in the first mode when signal content is present in the input signal and causes operation in the second mode when signal content is absent from the input signal.

2. The system of claim 1, wherein a ratio of the first forward gain to the second forward gain is approximately equal to a ratio of the second feedback gain to the first feedback gain.

3. The system of claim 1, wherein the forward signal path comprises an amplifier, and the control subsystem is configured to maintain an amplifier gain of the amplifier approximately constant between the first mode and the second mode.

4. The system of claim 1, wherein the forward signal path comprises a quantizer, and the forward gain is a signal gain of the quantizer.

5. The system of claim 4, wherein:
the quantizer comprises:
a preamplifier stage; and
a comparator stage configured to compare an output of the preamplifier stage with a triangular periodic waveform to generate a pulse-width modulation waveform that is output by the quantizer; and
wherein the forward gain is a signal gain of the comparator stage.

6. The system of claim 5, wherein the control subsystem is configured to control the forward gain by controlling a rate of change with respect to time of the triangular periodic waveform.

7. The system of claim 1, wherein the forward signal path and the feedback signal path are integral to a modulator.

8. The system of claim 7, wherein the modulator is a pulse-width modulator.

9. The system of claim 1, wherein the control subsystem is configured to control the feedback path gain by controlling a variable feedback impedance of the signal feedback path.

10. The system of claim 9, wherein:
the forward signal path comprises an amplifier; and
the control subsystem is configured to maintain an amplifier gain of the amplifier approximately constant between the first mode and the second mode by controlling a variable input impedance of the forward signal path based on the variable feedback impedance.

11. A method comprising, in a system having a forward signal path having a forward gain and configured to receive an input signal at an input and generate an output signal at an output as a function of the input signal and a feedback signal path having a feedback gain and coupled between the output and the input:
operating the forward signal path and the feedback signal path in at least two modes comprising:
a first mode in which the forward gain is a first forward gain and the feedback gain is a first feedback gain; and
a second mode in which the forward gain is a second forward gain smaller than the first forward gain and the feedback gain is a second feedback gain larger than the first feedback gain;
operating in the first mode when signal content is present in the input signal; and
operating in the second mode when signal content is absent from the input signal.

12. The method of claim 11, wherein a ratio of the first forward gain to the second forward gain is approximately equal to a ratio of the second feedback gain to the first feedback gain.

13. The method of claim 11, wherein the forward signal path comprises an amplifier, and the method further comprises maintaining an amplifier gain of the amplifier approximately constant between the first mode and the second mode.

14. The method of claim 11, wherein the forward signal path comprises a quantizer, and the forward gain is a signal gain of the quantizer.

15. The method of claim 14, wherein:
the quantizer comprises:
a preamplifier stage; and
a comparator stage configured to compare an output of the preamplifier stage with a triangular periodic waveform to generate a pulse-width modulation waveform that is output by the quantizer; and
wherein the forward gain is a signal gain of the comparator stage.

16. The method of claim 15, further comprising controlling the forward gain by controlling a rate of change with respect to time of the triangular periodic waveform.

17. The method of claim 11, wherein the forward signal path and the feedback signal path are integral to a modulator.

18. The method of claim 17, wherein the modulator is a pulse-width modulator.

19. The method of claim 11, further comprising controlling the feedback path gain by controlling a variable feedback impedance of the signal feedback path.

20. The method of claim 19, wherein:
the forward signal path comprises an amplifier; and
the method further comprises maintaining an amplifier gain of the amplifier approximately constant between the first mode and the second mode by controlling a variable input impedance of the forward signal path based on the variable feedback impedance.

* * * * *